US012633875B2

(12) United States Patent
Yokomizo et al.

(10) Patent No.: US 12,633,875 B2
(45) Date of Patent: May 19, 2026

(54) HARMONIC MIXER

(71) Applicant: Mitsubishi Electric Corporation, Tokyo (JP)

(72) Inventors: Shinya Yokomizo, Tokyo (JP); Sho Ikeda, Tokyo (JP); Yoshiaki Morino, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 18/773,317

(22) Filed: Jul. 15, 2024

(65) Prior Publication Data

US 2024/0372508 A1 Nov. 7, 2024

Related U.S. Application Data

(63) Continuation of application No. PCT/JP2022/011465, filed on Mar. 15, 2022.

(51) Int. Cl.
H03D 7/14 (2006.01)
H03D 7/12 (2006.01)
H03H 11/28 (2006.01)

(52) U.S. Cl.
CPC .............. H03D 7/12 (2013.01); H03H 11/28 (2013.01)

(58) Field of Classification Search
CPC .. H03D 7/06; H03D 7/08; H03D 7/10; H03D 7/12; H03D 7/125; H03D 7/14; H03D 7/1416; H03D 7/1425; H03D 7/1441; H03D 7/1458; H03D 7/1466; H03D 7/1475; H03D 7/1483; H03H 11/02; H03H 11/04; H03H 11/16; H03H 11/28

See application file for complete search history.

(56) References Cited

U.S. PATENT DOCUMENTS 7,962,114 B2 * 6/2011 Garcia ................. H03D 7/1475
455/333
2019/0319588 A1 10/2019 Wan

FOREIGN PATENT DOCUMENTS

| | | |
|---|---|---|
| CN | 110719072 A | 1/2020 |
| JP | 8-316737 A | 11/1996 |
| JP | 2001-223956 A | 8/2001 |
| WO | WO 2015/001924 A1 | 1/2015 |

OTHER PUBLICATIONS

Extended European Search Report for European Application No. 22931981.9, dated Mar. 3, 2025.

(Continued)

*Primary Examiner* — Long Nguyen

(74) *Attorney, Agent, or Firm* — Birch, Stewart, Kolasch & Birch, LLP

(57) ABSTRACT

Disclosed is a harmonic mixer including N transistors, an RF terminal, N LO terminals, an IF terminal, a series resonant circuit, and an IF matching circuit, in which when the RF frequency of a high frequency signal is identical or close to the maximum oscillation frequency of the transistors, the impedance seen from the IF terminal toward an output terminal at the RF frequency becomes low, and the impedance seen from the IF terminal toward the output terminal at an IF frequency is the combination of the impedance of the series resonant circuit and the impedance of the IF matching circuit.

3 Claims, 5 Drawing Sheets

(56)         References Cited

OTHER PUBLICATIONS

Wang et al., "A Terahertz Molecular Clock on CMOS Using High-Harmonic-Order Interrogation of Rotational Transition for Medium-/Long-Term Stability Enhancement," IEEE Journal of Solid-State Circuits, vol. 56, No. 2, 2021, pp. 566-580.
European Communication pursuant to Article 94(3) EPC for European Application No. 22 931 981.9, dated Oct. 23, 2025.
European Summons to Attend Oral Proceedings Pursuant to Rule 115(1) EPC for European Application No. 22 931 981.9, dated Mar. 25, 2026.

* cited by examiner

HARMONIC MIXER

CROSS REFERENCE TO RELATED APPLICATION

This application is a Continuation of PCT International Application No. PCT/JP2022/011465, filed on Mar. 15, 2022, which is hereby expressly incorporated by reference into the present application.

TECHNICAL FIELD

The present disclosure relates to a harmonic mixer.

BACKGROUND ART

Switching-type harmonic mixers are known as a technology of performing low-loss frequency conversion in a sub-terahertz band. For example, a frequency converter in which the source terminals of N switch transistors are connected to an input terminal, and the drain terminals of the N switch transistors are connected to an output terminal is described in Patent Literature 1. Here, N is an integer greater than or equal to 2. When N local oscillation signals whose phases differ from one another by 360/N degrees are inputted to the gate terminals and a high frequency signal is inputted to the input terminal, the frequency converter functions as an N-th harmonic mixer which outputs a signal whose frequency is shifted with respect to that of the input signal from the output terminal.

CITATION LIST

Patent Literature

Patent Literature 1: International Publication Number WO/2015/001924

SUMMARY OF INVENTION

Technical Problem

In the harmonic mixer described in Patent Literature 1, when the high frequency signal which is the input signal has an RF frequency close to the maximum oscillation frequency of the transistors, the isolation between the source and drain terminals of the switch transistors degrades. Therefore, a problem with the harmonic mixer is that the influence of the characteristic of an IF matching circuit at the RF frequency upon the impedance seen from the RF terminal toward the output terminal causes degradation in the noise figure (referred to as "NF" hereinafter) characteristic of the harmonic mixer.

The present disclosure is made to solve the above-mentioned problem, and it is therefore an object of the present disclosure to provide a harmonic mixer which provides a low NF even when the isolation of transistors degrades.

Solution to Problem

According to the present disclosure, there is provided a harmonic mixer including: multiple transistors having respective first terminals, respective second terminals, and respective third terminals; an RF terminal which is connected to the second terminals, to receive a high frequency signal as input; multiple LO terminals which are connected to the respective first terminals, to receive local oscillation signals as input; an IF terminal which is connected to the third terminals, and from which an intermediate frequency signal is outputted; a series resonant circuit which is disposed between the IF terminal and a ground terminal, and whose resonance frequency is an RF frequency of the high frequency signal; and an IF matching circuit disposed between the IF terminal and an output terminal, in which, when the RF frequency is identical or close to a maximum oscillation frequency of the transistors, impedance seen from the IF terminal toward the output terminal at the RF frequency becomes low, and impedance seen from the IF terminal toward the output terminal at an IF frequency of the intermediate frequency signal is a combination of impedance of the series resonant circuit and impedance of the IF matching circuit.

Advantageous Effects of Invention

According to the present disclosure, when the RF frequency of the high frequency signal is identical or close to the maximum oscillation frequency of the transistors, the impedance seen from the IF terminal toward the output terminal at the RF frequency becomes low, and the impedance seen from the IF terminal toward the output terminal at the IF frequency is the combination of the impedance of the series resonant circuit and the impedance of the IF matching circuit. Even when the RF frequency of the high frequency signal is identical or close to the maximum oscillation frequency of the transistors, and thus the isolation of the transistors degrades, the impedance seen from the IF terminal toward the output terminal at the RF frequency becomes low and the impedance seen from the IF terminal toward the output terminal at the IF frequency becomes one at which power matching can be established, so that the harmonic mixer according to the present disclosure can implement a low NF.

DESCRIPTION OF EMBODIMENTS

Embodiment 1

Figure 1:
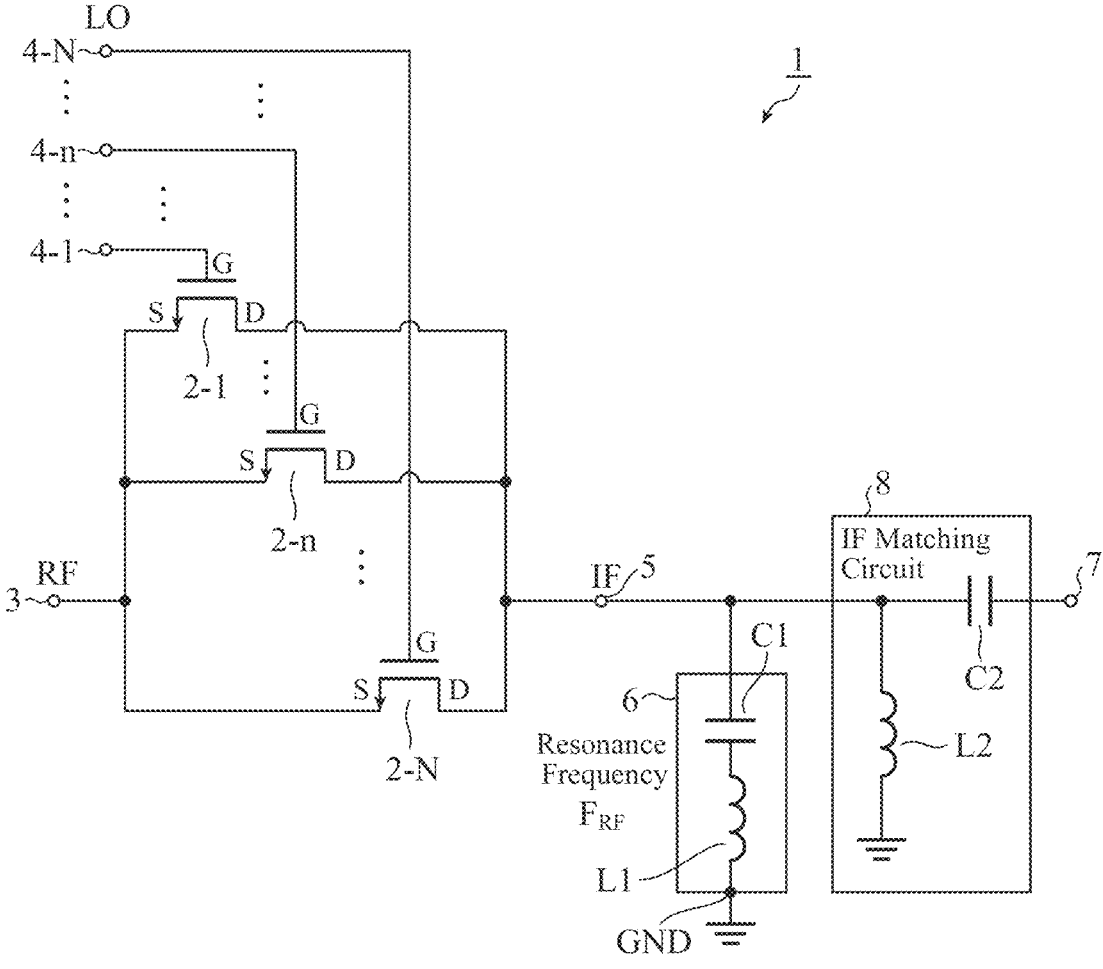
FIG. 1 is a circuit diagram showing an example of the configuration of a harmonic mixer according to Embodiment 1.

FIG. 1 is a circuit diagram showing an example of the configuration of a harmonic mixer 1 according to Embodiment 1. The harmonic mixer 1 shown in FIG. 1 receives an input signal which is a high frequency signal and local oscillation signals, and outputs a signal which is a result of performing frequency conversion on the input signal. For example, when the RF frequency of the input signal is $F_{RF}$, the IF frequency of an intermediate frequency signal is $F_{IF}$, and the local oscillation frequency of the local oscillation signals is $F_{LO}$, the harmonic mixer 1 is an N-th one that outputs a signal having the IF frequency $F_{IF}$ ($=F_{RF}=N\times F_{LO}$). Here, N is an integer greater than or equal to 2.

The harmonic mixer 1 includes N transistors 2-$n$, an RF terminal 3, N LO terminals 4-$n$, an IF terminal 5, a series resonant circuit 6, an output terminal 7, and an IF matching circuit 8. n is an integer greater than or equal to 1 and less than or equal to N. Each of N transistors 2-$n$ is, for example, a field effect transistor (FET) having a gate terminal G which is a first terminal, a source terminal S which is a second terminal, and a drain terminal D which is a third terminal. The N source terminals S are connected to one point and the N drain terminals D are connected to one point, so that the N transistors 2-$n$ are connected in parallel.

The RF terminal 3 is an input terminal connected to the N source terminals S, and a high frequency signal having a high frequency (RF frequency $F_{RF}$) is inputted, as the input signal, to the RF terminal. The N LO terminals 4-$n$ are connected to the respective N gate terminals G of the N transistors 2-$n$, and the local oscillation signals having the local oscillation frequency (LO frequency $F_{LO}$) are inputted to the N LO terminals. For example, the local oscillation signals each having a phase difference of 360(n–1)/N degrees are inputted to the respective N LO terminals 4-$n$. The IF terminal 5 is connected to the N drain terminals D, and an intermediate frequency signal having the intermediate frequency (IF frequency $F_{IF}$) is outputted from the IF terminal.

The series resonant circuit 6 is disposed between the IF terminal 5 and a ground terminal GND, and resonates at a preset frequency. The ground terminal GND has a ground potential which is a reference potential. For example, the series resonant circuit 6 is an LC resonance circuit including a capacitor C1 and an inductor L1 which are connected in series. In the series resonant circuit 6, the IF terminal 5 is connected to one terminal of the capacitor C1 and the inductor L1 is connected to the other terminal of the capacitor, and the ground terminal GND is connected to the inductor L1. For example, in the series resonant circuit 6, the resonance frequency is set to the RF frequency $F_{RF}$ of the high frequency signal.

The IF matching circuit 8 is disposed between the IF terminal 5 and the output terminal 7, and matches the impedance of the IF terminal 5 to that of the output terminal 7. For example, the IF matching circuit 8 includes a capacitor C2 and an inductor L2. In the IF matching circuit 8, the IF terminal 5 is connected to one terminal of the capacitor C2, and the output terminal 7 is connected to the other terminal of the capacitor. The IF terminal 5 is connected to one terminal of the inductor L2, and the other terminal of the inductor is grounded.

The high frequency signal having the RF frequency $F_{RF}$ is inputted to the RF terminal 3. The local oscillation signals having a phase of 0 degrees, . . . , a phase of 360(n–1)/N degrees, . . . , and a phase of 360(N–1)/N degrees are inputted, via the LO terminals 4-1, . . . , 4-$n$, . . . , and 4-N, to the gate terminals G of the transistors 2-1, . . . , 2-$n$, . . . , and 2-N. The transistors 2-1, . . . , 2-$n$, . . . , and 2-N perform switching of electrically connecting the source terminals S and the drain terminals D according to the local oscillation signals inputted to the gate terminals G. As a result, each of the transistors performs frequency conversion on the high frequency signal inputted to the RF terminal 3, to generate an intermediate frequency signal having the IF frequency $F_{IF}$. The intermediate frequency signal is outputted to the IF terminal 5, passes through the IF matching circuit 8, and is outputted from the output terminal 7.

Figure 2:
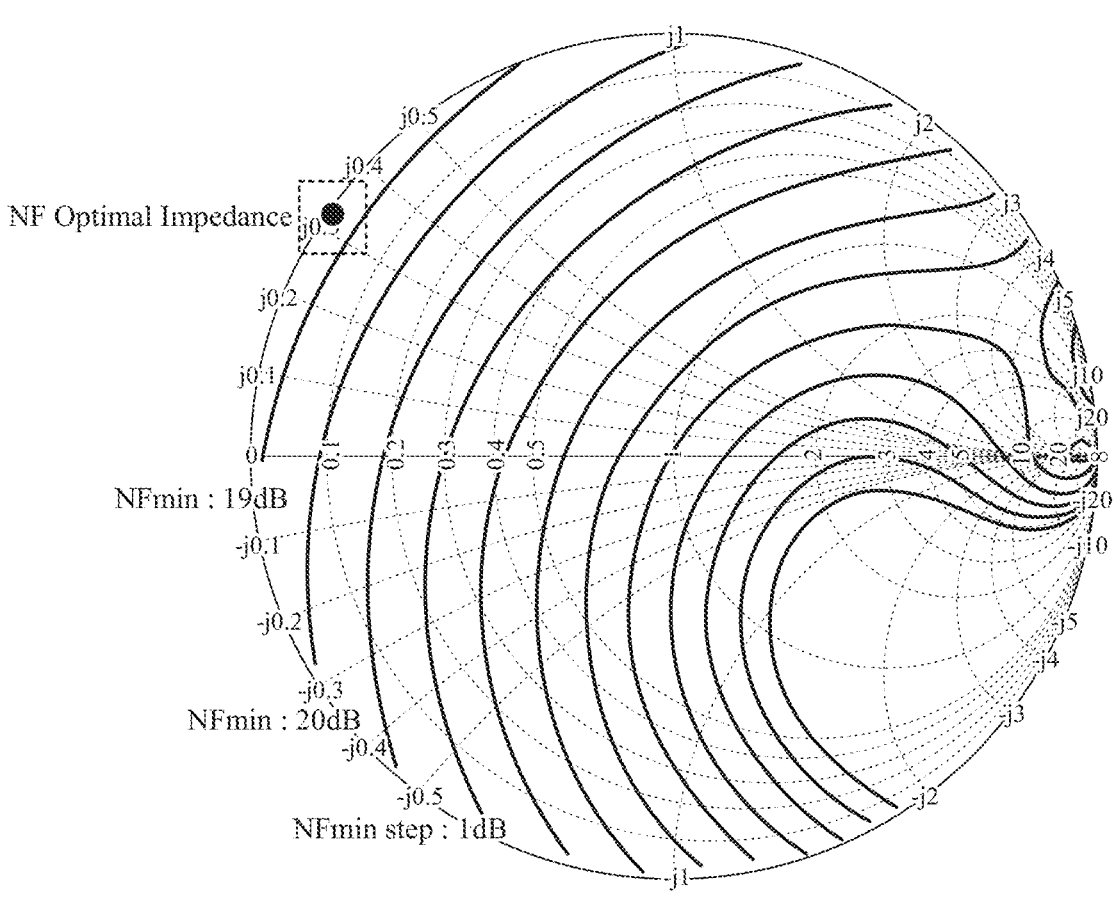
FIG. 2 is a Smith chart showing an example of a result of a simulation of the minimum noise figure when the impedance at the RF frequency of an IF matching circuit is varied.

FIG. 2 is a Smith chart showing an example of a result of a simulation of the minimum noise figure (referred to as "$NF_{min}$" hereinafter) when the impedance at the RF frequency $F_{RF}$ of the IF matching circuit 8 is varied, and shows $NE_{min}$ which is calculated by performing a load pull simulation of the IF terminal 5 at the RF frequency $F_{RF}$.

This simulation is performed on a fourth harmonic mixer which is configured using a 45 nm SOI CMOS process to have the same circuit configuration as the harmonic mixer 1, and which is designed in such a way that the RF frequency $F_{RF}$ is 300 GHz, the LO frequency $F_{LO}$ is 70 GHZ, and the IF frequency $F_{IF}$ is 20 GHz. An RF matching circuit is separately disposed at the RF terminal of the above-mentioned fourth harmonic mixer, the design is performed in such a way that the impedance seen from the IF terminal at the RF frequency $F_{RF}$ is 50Ω, and a 50 Ω port is disposed at the input terminal of the above-mentioned fourth harmonic mixer.

In addition, a port is disposed at the IF terminal of the above-mentioned fourth harmonic mixer, and $NF_{min}$ of the fourth harmonic mixer at each impedance is calculated by sweeping the impedance of this port.

As shown in FIG. 2, $NF_{min}$ varies by the impedance at the IF terminal 5 at the RF frequency $F_{RF}$, and $NF_{min}$ is improved as the impedance becomes lower. An NF optimal point shown in FIG. 2 is the impedance at the IF terminal at the RF frequency $F_{RF}$ at which $NF_{min}$ is the smallest in this load pull simulation.

Here, when the RF frequency $F_{RF}$ is identical or close to the maximum oscillation frequency $F_{max}$ of the transistors 2-$n$, the isolation between the source terminals S and the drain terminals D in the transistors 2-$n$ degrades. As a result, the impedance at the IF terminal 5 becomes visible from the RF terminal 3, and the $NF_{min}$ characteristic degrades.

Accordingly, in the harmonic mixer 1, the impedance at the IF terminal 5, i.e. the impedance seen from the IF terminal 5 toward the output terminal 7 is made to be a low impedance at the RF frequency $F_{RF}$, and to be impedance at which it is possible to establish power matching at the IF frequency $F_{IF}$. As a result, even when the isolation of the transistors 2-$n$ degrades, the harmonic mixer 1 for reception having a low NF is implemented.

Figure 3:
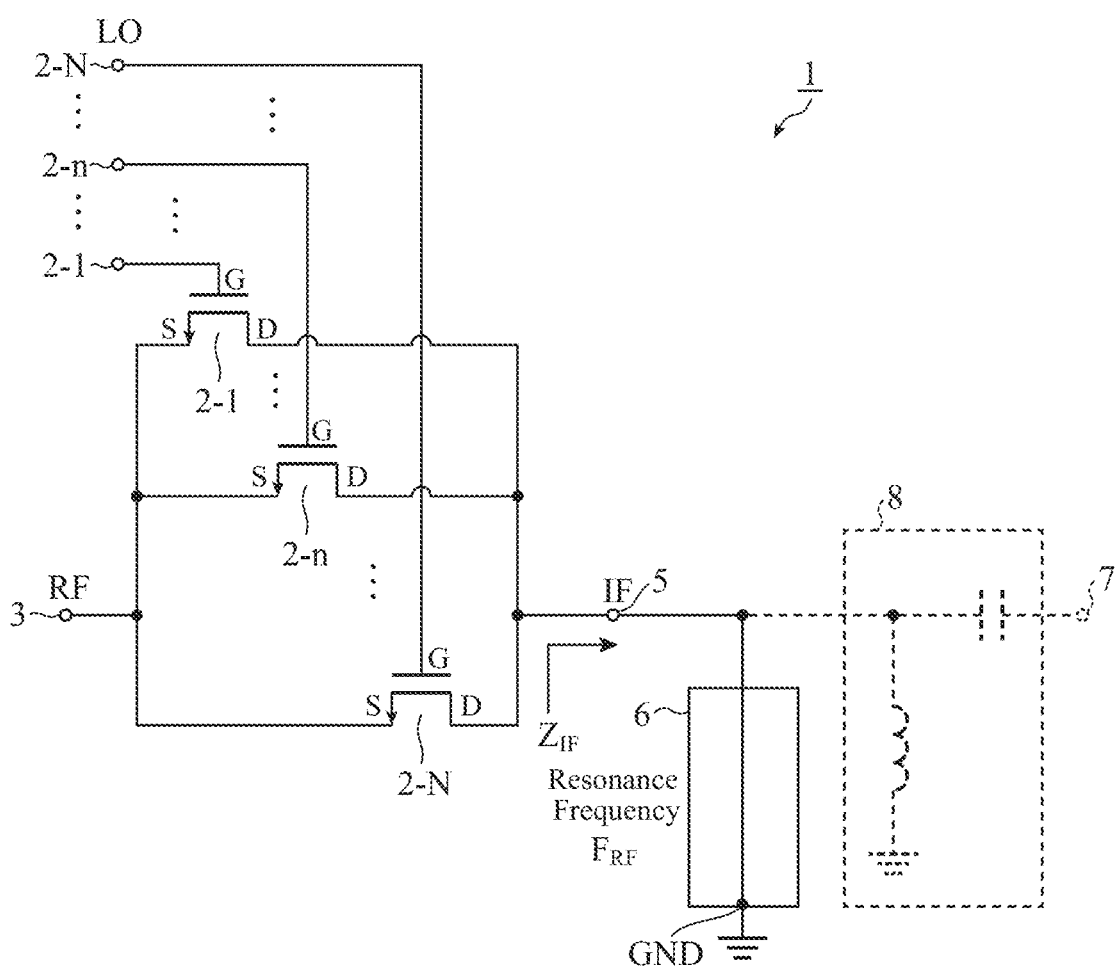
FIG. 3 is a view showing the impedance seen from an IF terminal toward an output terminal at the RF frequency in the harmonic mixer according to Embodiment 1.

FIG. 3 is a view showing the impedance $Z_{IF}$ seen from the IF terminal 5 toward the output terminal 7 at the RF frequency $F_{RF}$ in the harmonic mixer 1. As shown in FIG. 3, the impedance seen from the IF terminal 5 toward the output terminal 7 at the RF frequency $F_{RF}$ is denoted by $Z_{IF}$. Because the resonance frequency of the series resonant circuit 6 is the RF frequency $F_{RF}$, the series resonant circuit 6 is virtually short-circuited via the ground terminal GND, and the impedance of the series resonant circuit 6 becomes zero. Because the impedance of the IF matching circuit 8 becomes invisible from the IF terminal 5, as shown by a broken line in FIG. 3, the impedance $Z_{IF}$ seen from the IF terminal 5 toward the output terminal 7 at the RF frequency $F_{RF}$ becomes zero, i.e. sufficiently low.

Figure 4:
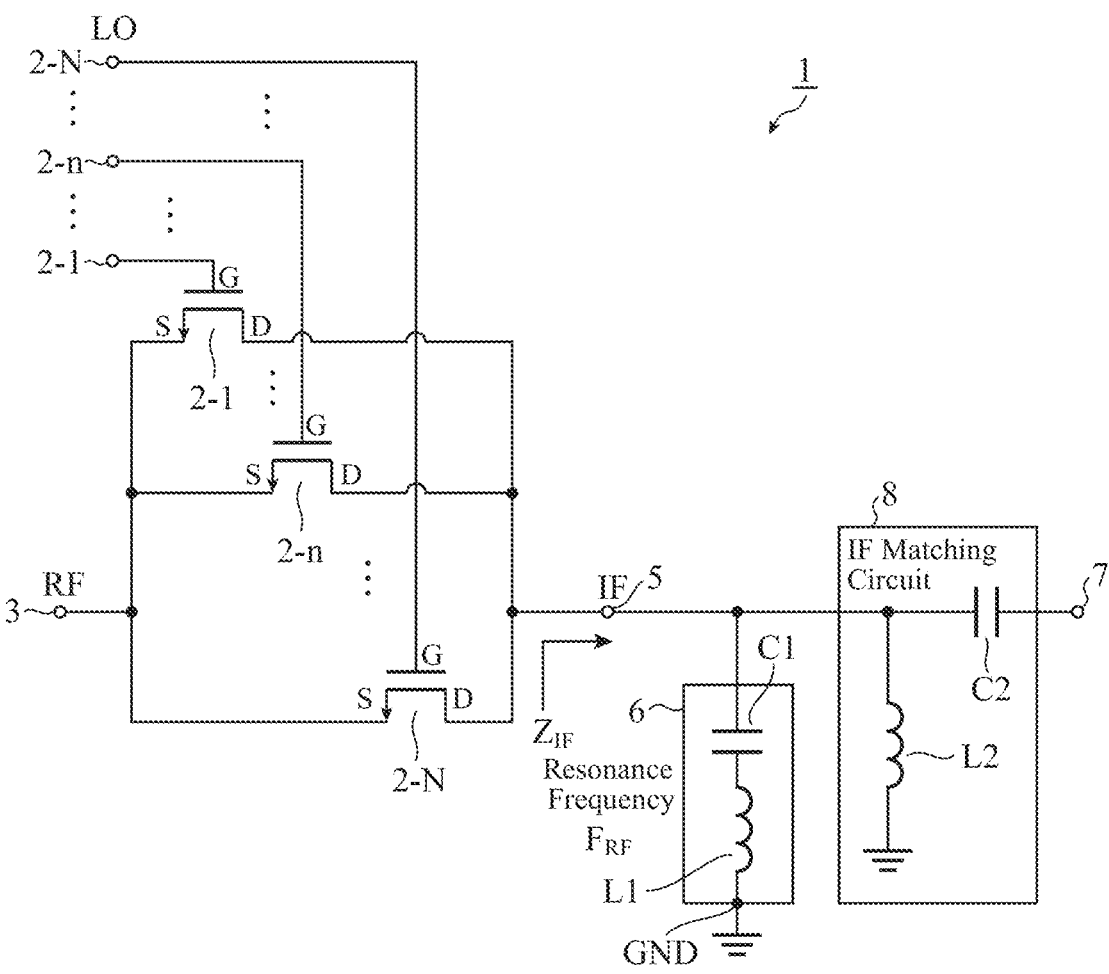
FIG. 4 is a view showing the impedance seen from the IF terminal toward the output terminal at an IF frequency in the harmonic mixer according to Embodiment 1.

FIG. 4 is a view showing the impedance seen from the IF terminal 5 toward the output terminal 7 at the IF frequency $F_{IF}$ in the harmonic mixer 1. As shown in FIG. 4, the impedance seen from the IF terminal 5 toward the output terminal 7 at the IF frequency $F_{IF}$ is denoted by $Z_{IF}$. The impedance of the series resonant circuit 6 is not zero at the IF frequency $F_{IF}$, and the impedance of the IF matching circuit 8 becomes visible from the IF terminal 5. More specifically, the impedance $Z_{IF}$ seen from the IF terminal 5 toward the output terminal 7 at the IF frequency $F_{IF}$ becomes one which is the combination of the impedance of the series resonant circuit 6 and the impedance of the IF matching circuit 8.

For the impedance $Z_{IF}$ which is the combination of the impedance of the series resonant circuit 6 and the impedance of the IF matching circuit 8, the circuit constants of the series resonant circuit 6 and the IF matching circuit 8 are set in such a way that power matching can be established.

In the harmonic mixer 1, when the RF frequency $F_{RF}$ is identical or close to the maximum oscillation frequency $F_{max}$ of the transistors 2-$n$, the impedance $Z_{IF}$ seen from the IF terminal 5 toward the output terminal 7 at the RF frequency $F_{RF}$ becomes low, and the impedance $Z_{IF}$ seen from the IF terminal 5 toward the output terminal 7 at the IF frequency $F_{IF}$ is the combination of the impedance of the series resonant circuit 6 and the impedance of the IF matching circuit 8. As a result, the harmonic mixer 1 can implement a low NF.

Although the case where in the harmonic mixer 1 the IF matching circuit 8 includes the capacitor C2 and the inductor L2 is shown above, this embodiment is not limited to this example, and the IF matching circuit 8 should just have a circuit configuration in which power matching can be established at the IF frequency.

Further, although the harmonic mixer 1 in which the RF terminal 3 is connected to the N source terminals S of the N transistors 2-$n$, and the IF terminal 5 is connected to the N drain terminals D of the N transistors 2-$n$ is shown, this embodiment is not limited to this example. For example, the harmonic mixer may have a configuration in which the RF terminal 3 is connected to the N drain terminals D of the N transistors 2-$n$, and the IF terminal 5 is connected to the N source terminals S of the N transistors 2-$n$.

As mentioned above, the harmonic mixer 1 according to Embodiment 1 includes: the N transistors 2-$n$; the RF terminal 3 to which a high frequency signal is inputted; the N LO terminals 4-$n$ to which local oscillation signals are inputted; the IF terminal 5 from which an intermediate frequency signal is outputted; the series resonant circuit 6 which is disposed between the IF terminal 5 and the ground terminal GND, and whose resonance frequency is the RF frequency $F_{RF}$ of the high frequency signal; and the IF matching circuit 8 disposed between the IF terminal 5 and the output terminal 7.

In the harmonic mixer 1, when the RF frequency $F_{RF}$ of the high frequency signal is identical or close to the maximum oscillation frequency $F_{max}$ of the transistors 2-$n$, the impedance $Z_{RF}$ seen from the IF terminal 5 toward the output terminal 7 at the RF frequency $F_{RF}$ becomes low, and the impedance $Z_{IF}$ seen from the IF terminal 5 toward the output terminal 7 at the IF frequency $F_{IF}$ is the combination of the impedance of the series resonant circuit 6 and the impedance of the IF matching circuit 8.

As a result, because even when the isolation of the transistors 2-$n$ degrades, the impedance $Z_{RF}$ at the RF frequency $F_{RF}$ becomes low and the impedance $Z_{IF}$ at the IF frequency $F_{IF}$ becomes one at which power matching can be established, the harmonic mixer 1 can implement a low NF.

In the harmonic mixer 1 according to Embodiment 1, the local oscillation signals each having a phase difference of 360(n−1)/N degrees are inputted to the respective N LO terminals 4-$n$. As a result, the harmonic mixer 1 can perform frequency conversion on the high frequency signal inputted to the RF terminal 3 in each of the transistors.

Embodiment 2

Figure 5:
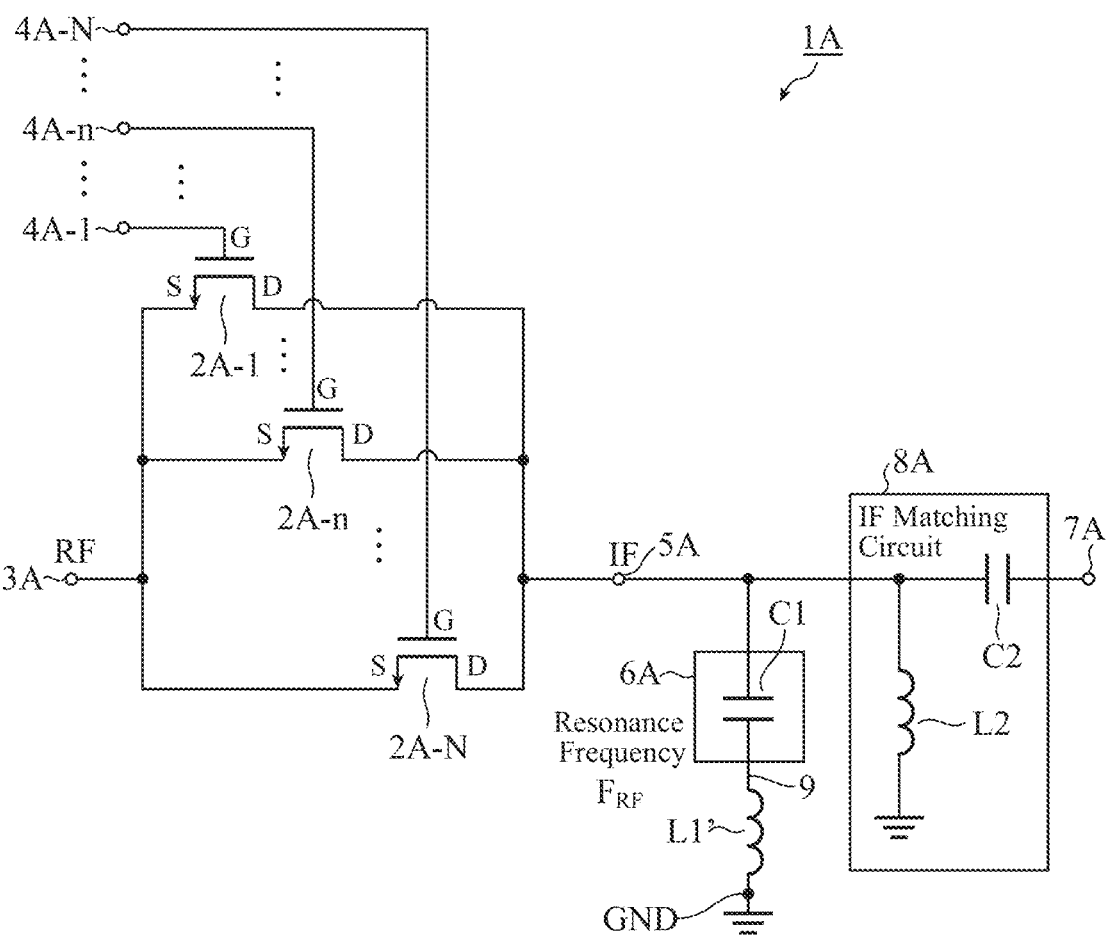
FIG. 5 is a circuit diagram showing an example of the configuration of a harmonic mixer according to Embodiment 2.

FIG. 5 is a circuit diagram showing an example of the configuration of a harmonic mixer 1A according to Embodiment 2. In FIG. 5, the harmonic mixer 1A receives an input signal which is a high frequency signal and local oscillation signals, and outputs a signal which is a result of performing frequency conversion on the input signal. For example, when the RF frequency of the input signal is $F_{RF}$, the IF frequency of an intermediate frequency signal is $F_{IF}$, and the local oscillation frequency of the local oscillation signals is $F_{LO}$, the harmonic mixer 1A is an N-th one that outputs a signal having the IF frequency $F_{IF}$ ($=F_{RF}=N×F_{LO}$). Here, N is an integer greater than or equal to 2.

The harmonic mixer 1A includes N transistors 2A-n, an RF terminal 3A, N LO terminals 4A-n, an IF terminal 5A, a series resonant circuit 6A, an output terminal 7A, and an IF matching circuit 8A. n is an integer greater than or equal to 1 and less than or equal to N. Each of the N transistors 2A-n is, for example, a field effect transistor (FET) having a gate terminal G which is a first terminal, a source terminal S which is a second terminal, and a drain terminal D which is a third terminal. The N source terminals S are connected to one point and the N drain terminals D are connected to one point, so that the N transistors 2A-n are connected in parallel.

The RF terminal 3A is an input terminal connected to the N source terminals S, and a high frequency signal having an RF frequency $F_{RF}$ is inputted, as the input signal, to the RF terminal. The N LO terminals 4A-n are connected to the respective N gate terminals G of the N transistors 2A-n, and the local oscillation signals having the LO frequency $F_{LO}$ are inputted to the N LO terminals. For example, the local oscillation signals each having a phase difference of 360(n−1)/N degrees are inputted to the respective N LO terminals 4A-n. The IF terminal 5A is connected to the N drain terminals D, and an intermediate frequency signal having the IF frequency $F_{IF}$ is outputted from the IF terminal.

The series resonant circuit 6A is disposed between the IF terminal 5A and a ground terminal GND, and resonates at a preset frequency. The series resonant circuit 6A is an LC resonance circuit including a capacitor C1 and a parasitic inductance L1' of a wire 9. In the series resonant circuit 6A, the IF terminal 5A is connected to one terminal of the capacitor C1, and the wire 9 is connected to the other terminal of the capacitor. The wire 9 in which the parasitic inductance L1' is formed is connected to the ground terminal GND. The capacitor C1 is grounded via the parasitic inductance L1' of the wire 9. In the series resonant circuit 6A, the resonance frequency is set to the RF frequency $F_{RF}$ of the high frequency signal.

In the harmonic mixer 1A, when the RF frequency $F_{RF}$ is identical or close to the maximum oscillation frequency $F_{max}$ of the transistors 2A-n, the impedance $Z_{IF}$ seen from the IF terminal 5A toward the output terminal 7A at the RF frequency $F_{RF}$ becomes low, and the impedance $Z_{IF}$ seen from the IF terminal 5A toward the output terminal 7A at the IF frequency $F_{IF}$ is the combination of the impedance of the series resonant circuit 6A and the impedance of the IF matching circuit 8A. As a result, even when the isolation of the transistors 2A-n degrades, the harmonic mixer 1A can implement a low NF.

Because in the harmonic mixer 1A the series resonant circuit 6A includes the capacitor C1 and the wire 9, the inductor L1 which the series resonant circuit 6 includes is unnecessary. As a result, the series resonant circuit 6A is downsized, and a downsizing of the harmonic mixer 1A can also be achieved.

Further, because in the series resonant circuit 6A the capacitor C1 is connected as a shunt, the inductance value of the parasitic inductance L1' of the shunt which is used in the IF matching circuit 8A in order to establish power matching at the IF frequency $F_{IF}$ can be reduced. As a result, a downsizing of the inductor which constitutes the series resonant circuit 6A can be achieved. In general, in IF matching circuits, the inductor has a larger size than the capacitor. Therefore, a downsizing of the inductor results in a downsizing of the series resonant circuit 6A, and, in turn, can cause a downsizing of the harmonic mixer 1A.

Because the parasitic inductance L1' of the wire 9 increases at the RF frequency $F_{RF}$, the capacitance value of the capacitor C1 for setting the resonance frequency of the series resonant circuit 6A to the RF frequency $F_{RF}$ can also be made small, and thus the capacitor C1 can be downsized. Also as a result of this downsizing, the series resonant circuit 6A is downsized, and, in turn, the harmonic mixer 1A can be downsized.

Further, although the harmonic mixer 1A in which the RF terminal 3A is connected to the N source terminals S of the N transistors 2A-n, and the IF terminal 5A is connected to the N drain terminals D of the N transistors 2A-n is shown, this embodiment is not limited to this example. For example, the harmonic mixer may have a configuration in which the RF terminal 3A is connected to the N drain terminals D of the N transistors 2A-n, and the IF terminal 5A is connected to the N source terminals S of the N transistors 2A-n.

As mentioned above, in the harmonic mixer 1A according to Embodiment 2, the series resonant circuit 6A includes the capacitor C1 connected, via the wire 9, to the ground terminal GND, and the parasitic inductance L1' formed in the wire 9. In the series resonant circuit 6A, the inductor L1 which the series resonant circuit 6 includes is unnecessary. As a result, a downsizing of the harmonic mixer 1A can be achieved.

It is to be understood that a combination of embodiments can be made, a change can be made to any component in each of the embodiments, or any component in each of the embodiments can be omitted.

INDUSTRIAL APPLICABILITY

The harmonic mixer according to the present disclosure can be used for, for example, frequency converters in a sub terahertz band.

REFERENCE SIGNS LIST

1, 1A harmonic mixer, 2-1 to 2-N, 2A-1 to 2A-N transistor, 3, 3A RF terminal, 4-1 to 4-N, 4A-1 to 4A-N LO terminal, 5, 5A IF terminal, 6, 6A series resonant circuit, 7, 7A output terminal, 8, 8A IF matching circuit, and 9 wire.

The invention claimed is:

1. A harmonic mixer comprising:

multiple transistors having respective first terminals, respective second terminals, and respective third terminals;

an RF terminal which is connected to the second terminals, to receive a high frequency signal as input;

multiple LO terminals which are connected to the respective first terminals, to receive local oscillation signals as input;

an IF terminal which is connected to the third terminals, and from which an intermediate frequency signal is outputted;

a series resonant circuit which is disposed between the IF terminal and a ground terminal, and whose resonance frequency is an RF frequency of the high frequency signal; and an IF matching circuit disposed between the IF terminal and an output terminal, wherein when the RF frequency equals a maximum oscillation frequency of the transistors, impedance seen from the IF terminal toward the output terminal at the RF frequency becomes low relative to impedance when the RF frequency differs from the maximum oscillation frequency, and impedance seen from the IF terminal toward the output terminal at an IF frequency of the intermediate frequency signal is a combination of impedance of the series resonant circuit and impedance of the IF matching circuit.

2. The harmonic mixer according to claim 1, wherein when N is an integer greater than or equal to 2, n is an integer greater than or equal to 1 and less than or equal to N, and the multiple transistors are N transistors, and the local oscillation signals each having a phase difference of 360 (n−1)/N degrees are inputted to the respective N LO terminals.

3. The harmonic mixer according to claim 2, wherein the series resonant circuit comprises a capacitor connected, via a wire, to the ground terminal, and a parasitic inductance formed in the wire.

\* \* \* \* \*